United States Patent [19]

Temple

[11] Patent Number: 5,463,344
[45] Date of Patent: Oct. 31, 1995

[54] FAST TURN ON SWITCH CIRCUIT WITH PARALLEL MOS CONTROLLED THYRISTOR AND SILICON CONTROLLED RECTIFIER

[75] Inventor: Victor A. K. Temple, Clifton, N.Y.

[73] Assignee: Harris Corporation, Melbourne, Fla.

[21] Appl. No.: 51,839

[22] Filed: Apr. 26, 1993

[51] Int. Cl.⁶ .................................................. H03K 17/04
[52] U.S. Cl. ........................ 327/374; 327/428; 327/438; 327/380; 257/138
[58] Field of Search ........................ 307/630, 633, 307/646, 570; 257/133, 136, 692, 138, 147, 124; 327/420, 473, 380, 438, 428, 468, 432, 403, 376, 377, 374

[56] References Cited

U.S. PATENT DOCUMENTS

| | | | |
|---|---|---|---|
| 3,743,859 | 7/1973 | Exner | 327/420 |
| 4,130,767 | 12/1978 | Okuhara et al. | 307/646 |
| 4,551,643 | 11/1985 | Russell et al. | 257/138 |
| 4,672,245 | 6/1987 | Majumdar et al. | 327/375 |
| 5,283,463 | 2/1994 | Nguyen et al. | 257/692 |

*Primary Examiner*—Timothy P. Callahan
*Assistant Examiner*—Dinh T. Le
*Attorney, Agent, or Firm*—Rogers & Killeen

[57] ABSTRACT

A fast turn-on electrical switch circuit includes a silicon controlled rectifier ("SCR") connected substantially in parallel with a MOS controlled thyristor ("MCT"). When the switch is turned on, the MCT turns on almost immediately and carries the circuit load during the spreading time of the SCR. The SCR subsequently carries the circuit load when it is turned fully on because it has a smaller forward drop, due in part to its larger area and/or higher carrier lifetime. The MCT and SCR may be gated simultaneously from the same or separate sources or the SCR may be gated with a portion of the current from the MCT. The switch may be integrated into a single semiconductor device with alternating MCT regions and SCR regions.

28 Claims, 5 Drawing Sheets

FAST TURN ON SWITCH CIRCUIT WITH PARALLEL MOS CONTROLLED THYRISTOR AND SILICON CONTROLLED RECTIFIER

BACKGROUND OF THE INVENTION

The present invention relates to electrical switch circuits, and in particular to methods and circuits for decreasing the turn-on time in switches having silicon controlled rectifiers ("SCRs") through the innovative use of MOS controlled thyristors ("MCTs").

Electrical circuits containing SCR switches are well known. Often in such circuits the switch turn-on time is limited by the capability of the SCR. An SCR typically has a relatively small portion of its active area that is initially turned on by a gate current, and thus has an initial forward voltage drop that is relatively large. The period during which the active area of the device becomes active is called the SCRs spreading time. During this time, the forward voltage drop is relatively large compared to the voltage drop when the device is fully on. For example, an 8,000 volt SCR may have an initial forward voltage drop as large as 1,000 volts at the beginning of a 15 to 20 microsecond spreading time. By the end of the spreading time the voltage drop diminishes to a sustained forward voltage drop of 2 to 3 volts. The SCRs large initial forward voltage drop during the long spreading time limits the utility of SCR switches in applications where a source current changes rapidly with time, that is, has a relatively high di/dt, such as found in high voltage, 60 hertz power generators and power transmission equipment. In higher frequency circuits, important because of their smaller capacitance and inductance, di/dt is proportionally higher and more limiting.

The relatively high initial forward voltage drop also causes a larger and potentially damaging loss of energy in the device during turn on. In high frequency applications, where the device is being repeatedly turned on and off, the total power lost during the turn-on transients may be significant. Relatively, SCRs are limited in their ability to take current quickly but are adept in handling large currents over long periods of time. These facts limit the usefulness of SCRs for switching for short pulses and pulses with high di/dt.

To overcome these problems, it is known to place plural SCRs in parallel. For example, if the required di/dt capability of a switch is 2,000 amps/microsecond, and each SCR has a di/dt capability of 200 amps/microsecond and a surge capability of 2,000 amps, ten of the SCRs may be placed in parallel in a switch circuit to achieve the desired result. The switch circuit, because of the paralleled SCRs, has a total di/dt capability of 2,000 amps/microsecond. Note, however, that any one of the SCRs would be sufficient to carry the entire surge capability. After one of the SCRs is fully turned on and is able to carry the full current, the remaining nine SCRs are no longer needed. They may be switched out of the circuit at a cost of additional circuit complexity or the devices may be left to carry a current far below their individual rated capabilities. However, this solution wastes resources, takes up space that may be put to better use and increases the likelihood of failure of the device by introducing more elements.

In applications using SCRs to shape fast rising pulses, it is known to use relatively high power to obtain a pulse which can be shaped to a fast rising, lower voltage pulse. Typically, the slope of the di/dt curve for a given device decreases as the power across the device approaches the device's rated power. Thus, to obtain a relatively quick rise time, it is known to use a device with a higher power rating than necessary for the continuous load in order to operate within the sharp rising areas of the device's operating characteristics. For example, a person desiring a fast rising 100 volt pulse may use a 1,000 ampere pulse through a 1,000 ampere rated SCR in order to provide a pulse that can be shaped into a 100 ampere, ten times faster rising pulse. In such circumstances, it would be advantageous to have available a device which has a relatively sharp rising pulse throughout its operating characteristics so that the pulsing circuit does not need to use, otherwise unnecessary, higher power rated devices merely to obtain an acceptable rise time.

MCTs are power devices that are turned on quickly over their entire active area and have a very large di/dt capability. A description of such devices and explanation of their fabrication process may be found in U.S. Pat. No. 5,111,268 to V.A.K. Temple, which is hereby incorporated by reference. For example, a 600 volt, 75 amp MCT has a di/dt of up to 10,000 amps/microsecond and may be turned on in about 0.2 microseconds. However, MCTs are, at present, more expensive to manufacture than SCRs and have found limited application replacing SCRs. MCTs may have a somewhat larger sustained forward voltage drop than high voltage SCRs because the MCT manufacturing process presently produces a shorter carrier lifetime. MCTs may also have a somewhat smaller active area than SCRs due to limitations related to gate oxide defect density in the manufacturing process. It would be advantageous from a di/dt capability perspective and from a power loss perspective to replace SCRs in many applications with MCTs. However, the limitations of present MCTs have as yet limited their use as full replacement for SCRs.

It is, accordingly, an object of the present invention to provide a novel method and circuit using MCTs and SCRs to improve the turn-on time and di/dt capability of an electrical switch circuit while retaining the circuit's performance when the switch is fully turned-on.

It is a further objection of the present invention to provide a novel method of reducing the turn-on time of a switch by initially conducting switch current through a switching device with a relatively fast turn-on and subsequently through a switching device with a relatively small sustained forward voltage drop.

It is yet a further object of the present invention to provide a novel electrical switch circuit in which an SCR is connected electrically in parallel with a MCT to improve the turn-on time of the switch circuit.

It is still a further object of the present invention to provide a novel semiconductor switch having an SCR and MCT connected in parallel and integrated in a single semiconductor device.

These and many other objects and advantages will be readily apparent to ones skilled in the art to which the invention pertains from a perusal of the claims, the appended drawings, and the following detailed description of preferred embodiments.

DESCRIPTION OF PREFERRED EMBODIMENTS

Figure 1:
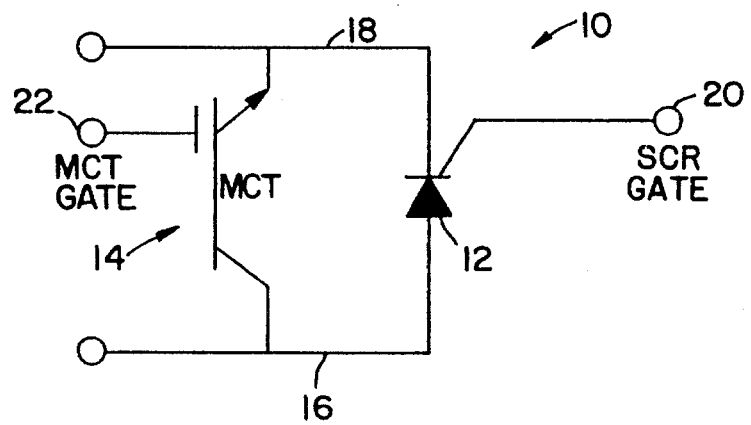
FIG. 1 is a schematic diagram of a circuit of the present invention.

With reference now to FIG. 1, the present invention includes an electrical switch circuit 10 having one or more SCRs 12 substantially in parallel with an MCT 14 (substantially in parallel meaning that other circuit elements may be included). In the circuit 10, the MCT and SCR have a common source 16 and a common drain 18. The gate 20 of the SCR and the gate 22 of the MCT may be provided with circuitry which simultaneously provides the appropriate gate current to the SCR and the appropriate gate voltage to the MCT to start the turn-on process approximately simultaneously. The MCT 14 may have a larger sustained forward voltage drop than that of the SCR 12.

In operation, the switch is turned on by applying gate voltage to the MCT which turns on almost instantaneously, typically in about 200 nanoseconds. When the MCT is on and the SCR is still turning on, switch current flows predominantly through the MCT without the large forward voltage drop found in the SCR during its spreading time. In the meantime, the SCR, having received gate current at about the same time as the MCT, is turning on more slowly.

Such switches can be formed from the discrete components or may be integrated into a monolithic device by well known integration techniques.

When the SCR is fully turned on, it has a smaller sustained forward voltage drop than the MCT and thus picks up substantially all of the current that was being carried by the MCT. Therefore the MCT carries substantially all of the current for the first few microseconds that the switch is turned on and the SCR carries the bulk of the on-state current thereafter. The higher surge capability of the SCR protects the circuit and the MCT against transients, surges, and the like.

The gate signal for the SCR is desirably as high as possible, at least during the spreading time. Amplifying gate SCRs are desirably used because they draw gate current from the source.

In an exemplary application of the present invention, an MCT may be substituted for the multiple extra SCRs that are used to carry the current during the spreading time. That is, one MCT may replace the SCRs that are needed only during initial turn of a switch, leaving a circuit with one MCT and one or two SCRs, with the number of remaining SCRs being determined from circuit load and reliability considerations. For example, the present invention might find application in pulse discharge capacitors, high pulse current circuits, lasers and other applications where turn-on losses are desirably eliminated or significantly reduced.

Figure 2:
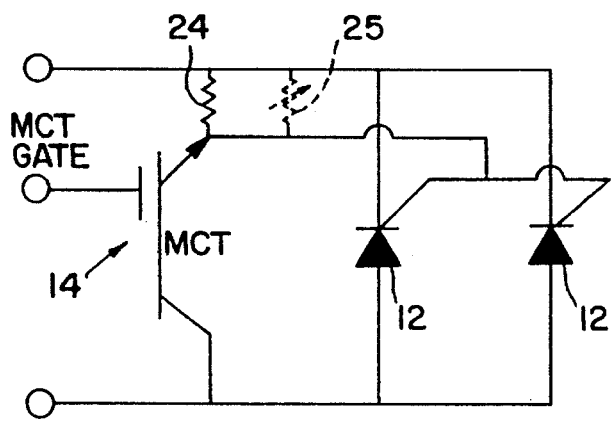
FIG. 2 is a schematic diagram of a further embodiment of the circuit of the present invention.

With reference now to FIG. 2, in a further embodiment of the present invention, gate current for the SCR 12 may be provided from the drain of the MCT 14. In this embodiment the SCR turn-on process begins later than that of the MCT, with the delay being seen in a longer time to reach the SCRs sustained forward voltage drop. As will be understood by those skilled in the art, after the MCT is turned on, a voltage will be developed across a resistor 24, which serves to gate the SCRs 12. Once the SCRs 12 are on, the voltage across the resistor 24 help to transfer voltage faster out of the MCT and into the SCR. The resistor 24 may be added in the current path of the MCT to ensure that the current path to the MCT has more resistance than the current path for the SCR, so that when the SCRs are fully turned on they have a smaller forward voltage drop than the MCTs. The circuit of FIG. 2 may find particular application where the small amount of gate voltage needed to operate the MCT 14 may control the operation of a switch circuit carrying thousands of volts. To protect the SCR gate from an overload of voltage, the resistance value of the resistor 24 should be selected with the gate's voltage rating in mind. Optionally, a circuit of the present invention may include a varistor 25 (shown in dashed lines) connected in parallel across the resistor 24. When selected using conventional overload prevention analysis, the varistor 25 is selected to correlate to the voltage rating of the gate of the SCRs 12.

Figure 3:
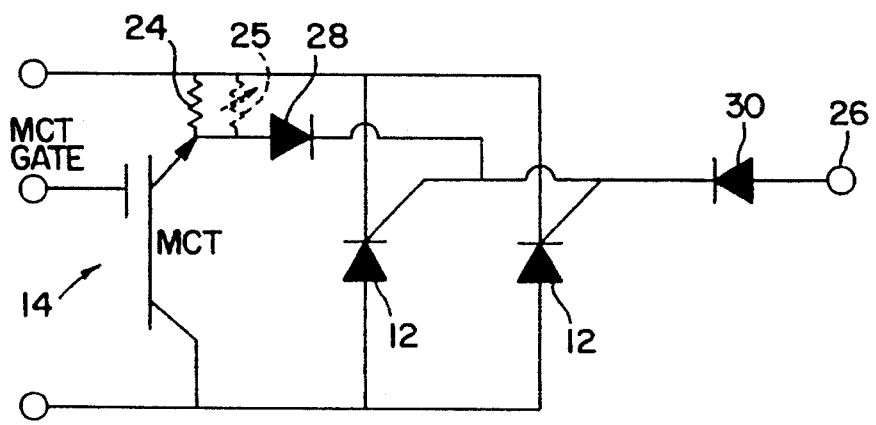
FIG. 3 is a schematic diagram of yet a further embodiment of the circuit of the present invention.

In a further embodiment illustrated in FIG. 3, gate current may be provided to the SCRs both by a gate 26 and from the drain of the MCT 14. The gate current provided from the MCT is higher assuring a harder turn on of the SCRs, but would arrive slightly later than the gate current from the gate current source 26. Diodes 28 and 30 may be included for circuit protection. Optionally, a varistor 25 can be placed across the resistor 24 to ensure that the SCR gate ratings are not exceeded. The optional varistor 25 may be placed in the circuit as shown in FIG. 3 or may be placed across both the resistor 24 and the diode 28.

Note that, in general, the resistor 24 used in the circuit of FIG. 3 may have a lower resistance than the resistor 24 in the circuit of FIG. 2. The (generally) lower resistance needed in the circuit of FIG. 3 stems from the fact that the SCR gate is being powered also by the gate current source 26 and therefor relatively less boost is needed from the resistor 24 to operate the SCR gate.

The portions of the circuits of FIGS. 2 and 3 where the drain of the MCT provides at least a portion of the SCRs gate current may also include other circuit elements such as inductors and/or capacitors to control the shape of the gate current as desired so that the SCRs follow a desired turn-on characteristic.

The use of any of the circuits in accordance with the present invention provides a cost-effective switch with a relatively high di/dt capability and surge capability. Additionally the dissipation of power in the device during turn on may be significantly reduced.

Figure 4:
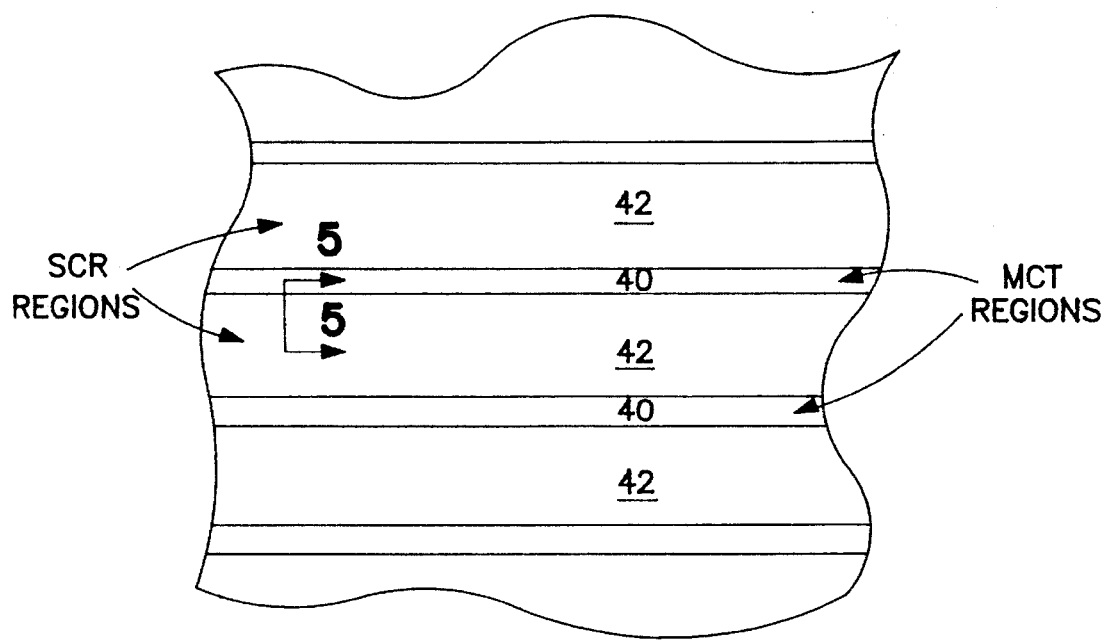
FIG. 4 is an overhead plan view of a portion of an active area of an embodiment of the present invention in a single semiconductor device (metal and gate layers removed for clarity).
Figure 5:
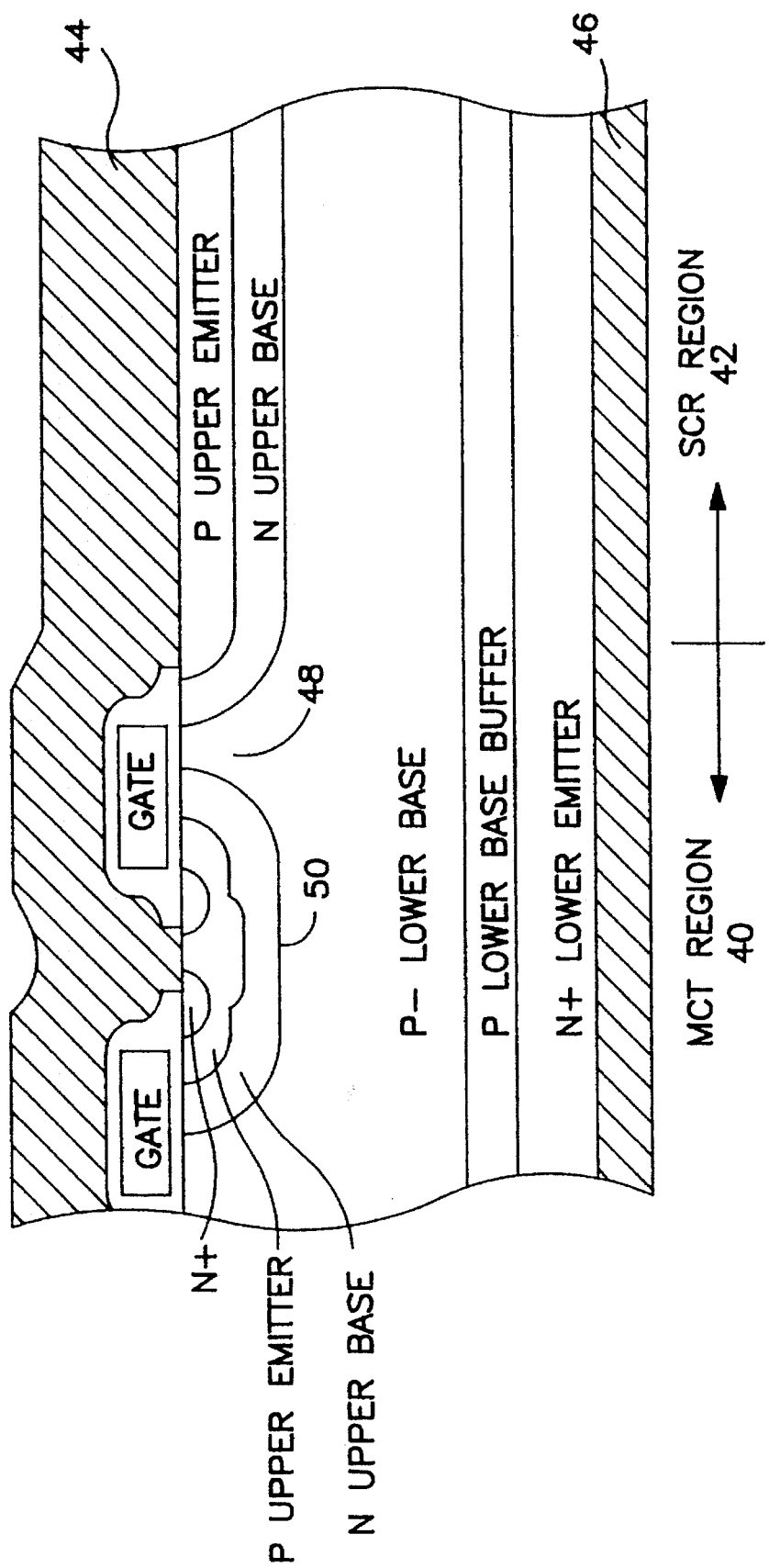
FIG. 5 is a vertical cross section through line 5—5 of FIG. 4.

With reference now to FIGS. 4 and 5, the MCT and SCR may be integrated into a single semiconductor device. As illustrated in FIG. 4, the device may include alternating MCT regions 40 and SCR regions 42. Each of the SCR regions 42 may, as illustrated in FIG. 5, include alternating layers of P and N type semiconductor material between anode and cathode metal layers 44 and 46. The layers may include a lower emitter 70, a lower base buffer 72, a lower base 74, an upper base 76, an upper emitter 78, source regions 80 and a gate 82. The MCT region 40 may include any of the various MCT gate and cell arrangements known in the art (e.g., square, hexagonal, atomic lattice, stripe), the illustrated embodiment merely being exemplary. Metal layer 44 is an anode in a P-type MCT as shown, or is a cathode in an N-type MCT having layers of semiconductor material opposite in type to that shown. The lower base, lower base buffer and lower emitter of the MCT may be coplanar with and of the same semiconductor type as the corresponding layers in the SCR.

The ratio of MCT region size to SCR region size may vary depending on device use. Where the current pulses are short or have a high di/dt, the MCT region size may be relatively increased.

Figure 6A:
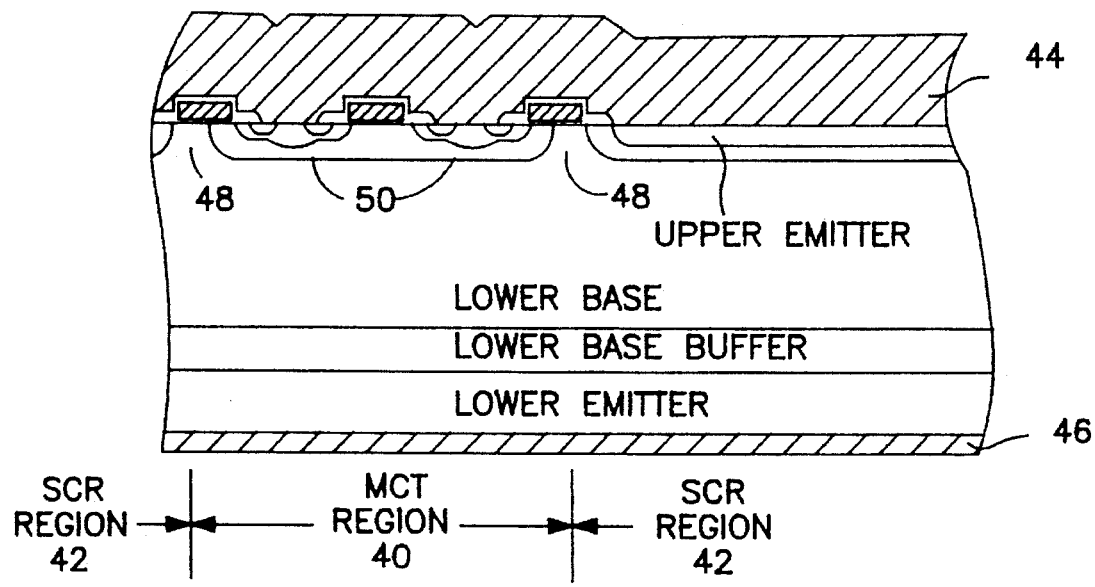
FIGS. 6a–6b are vertical cross sections of embodiments of the present invention illustrating multiple cell MCT regions.
Figure 6B:
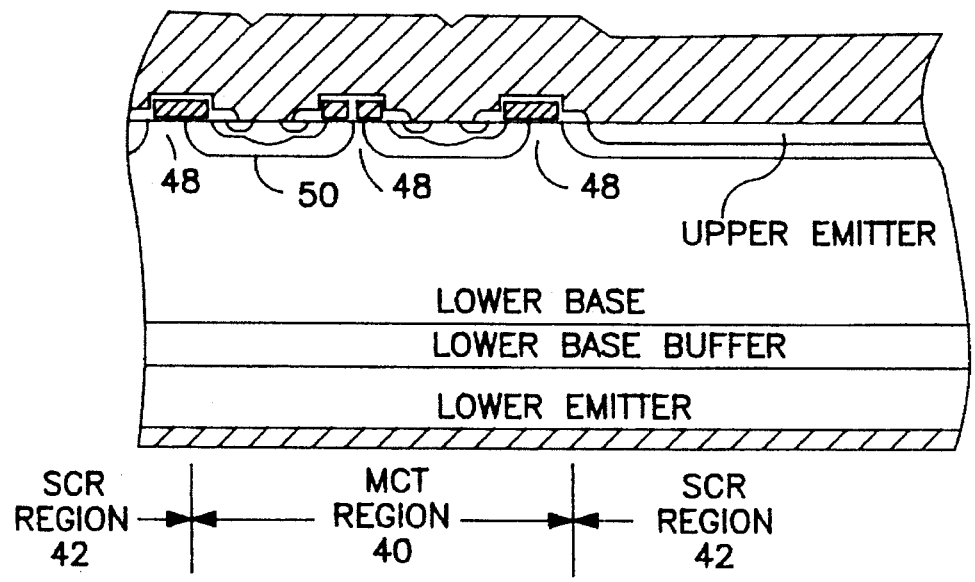

Further, the number and type of MCT cells may be varied depending on desired characteristics. As is known, an MCT device may include off-cells 48 which provide the ability to turn off the device and on-cells 50 which provide the capability to selectively permit the device to carry current. For example, off-cells 48 provide noise, temperature and dv/dt ruggedness, while the on-cells 50 provide di/dt capability. The MCT region may be wide enough for a single cell structure (such as the portion of the cell structure visible in FIG. 5), or may include multiple cells. With reference to FIG. 6*a*, the multiple cell structure may include on-cells 48 at the edges of the MCT region with off-cells 50 therebetween, or as illustrated in FIG. 6*b*, may include on-cells 48 between each row of off-cells 50.

Figure 7:
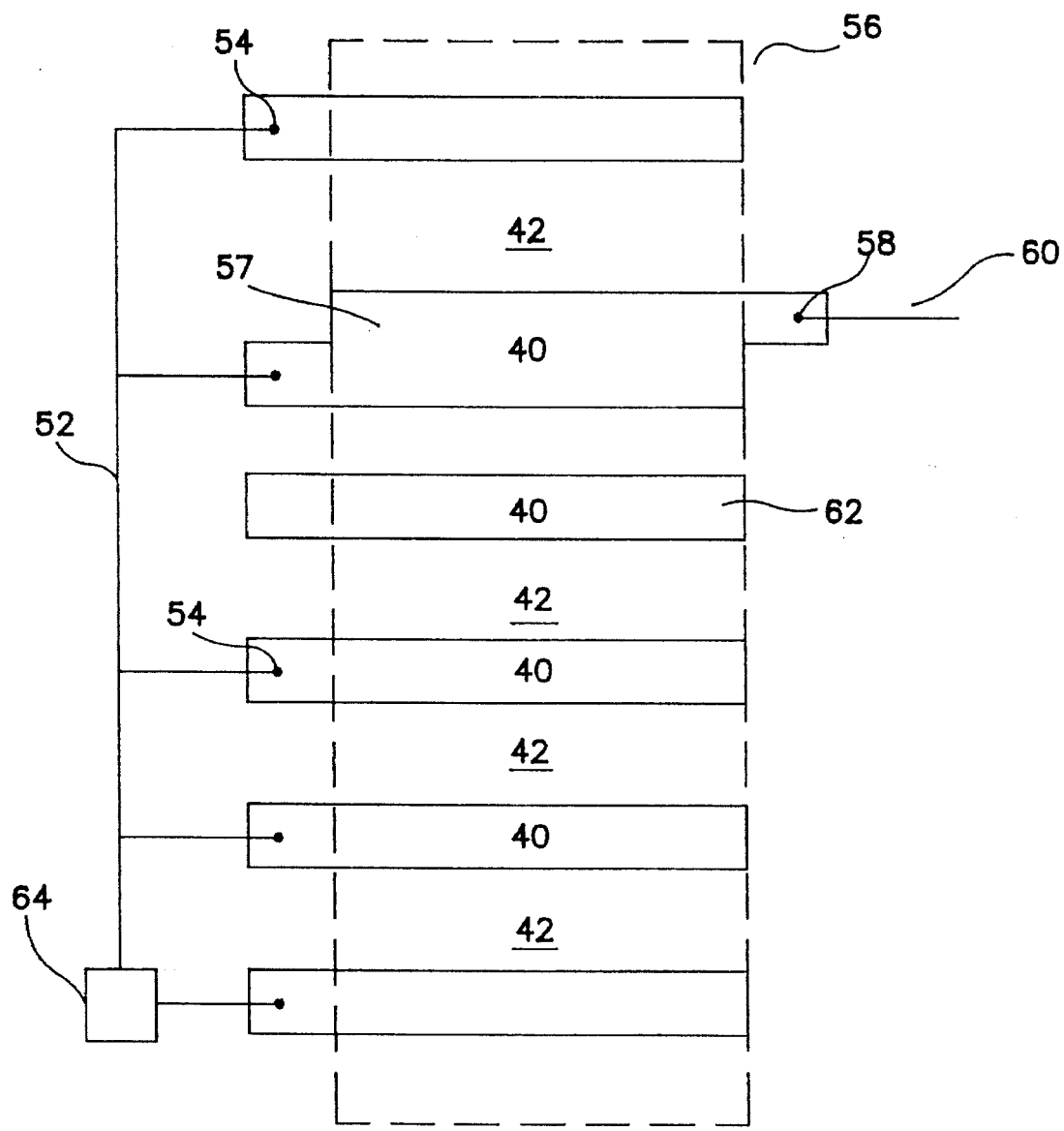
FIG. 7 is part schematic/part pictorial representation of an overhead view of the present invention illustrating several gate contact embodiments.

The present invention may include one of various gate metal contact embodiments, several of which are illustrated in FIG. 7. For example, the MCT gates may contact the metal gate runners 52 at contact windows 54 at the periphery of the active area 56 of the device. Where multiple rows 57 of MCT cells are present, gate contact may be made on the same or opposite sides (as illustrated by contact window 58 and runner 60) of the active area. Further, in the event an MCT region is defective (e.g., has a gate oxide defect) the defective region 62 may be left uncontacted by a gate runner. In order to reduce the number of wire bonds with external connections, the gate runners are desirably connected to a single (or a few) bonding point 64.

While preferred embodiments of the present invention have been described, it is to be understood that the embodiments described are illustrative only, and that the scope of the invention is to be defined solely by the appended claims when accorded a full range of equivalence, many variations and modifications naturally occurring to those skilled in the art from a perusal hereof.

What is claimed is:

1. A method of turning on a silicon controlled rectifier switch in which the initial forward voltage drop is reduced comprising the steps of:

connecting a MOS controlled thyristor in a first switched path substantially in parallel with the silicon controlled rectifier in a second switched path; and turning on the MOS controlled thyristor no later than turning on the silicon controlled rectifier so that the MOS controlled thyristor reduces the initial forward voltage drop in the circuit.

2. The method of claim 1 further comprising the step of providing a gate current to the silicon controlled rectifier from a drain of the MOS controlled thyristor.

3. The method of claim 1 further comprising the step of providing a gate voltage to the MOS controlled thyristor at a desired time interval with respect to the provision of a gate current to the silicon controlled rectifier.

4. The method of claim 1 wherein initially most of the current flow is through the MOS controlled thyristor and subsequently most of the current flow is through the silicon controlled rectifier.

5. An electrical switch circuit comprising a MOS controlled thyristor in a first switched path that is connected substantially in parallel with a second switched path comprising a silicon controlled rectifier.

6. The circuit of claim 5 wherein the gate of the MOS controlled thyristor is operated with respect to the gate of the silicon controlled rectifier so that initially most of the current flow is through the MOS controlled thyristor and subsequently most of the current flow is through the silicon controlled rectifier.

7. The circuit of claim 5 wherein immediately after turn-on of the switch, the MOS controlled thyristor substantially shunts the silicon controlled rectifier for a first period of time and subsequently the silicon controlled rectifier substantially shunts the MOS controlled thyristor.

8. The circuit of claim 5 wherein said MOS controlled thyristor and said silicon controlled rectifier are in adjacent regions in a monolithic integrated circuit structure.

9. A semiconductor switch comprising:

a silicon controlled rectifier with an initial forward voltage drop responsive to the rate of change of a current there across;

a MOS controlled thyristor in a first switched path that is substantially in parallel with a second switched path comprising said silicon controlled rectifier, said MOS controlled thyristor having a smaller initial forward voltage drop than said silicon controlled rectifier; and means for turning on said MOS controlled thyristor no later than said silicon controlled rectifier.

10. The semiconductor switch of claims 9 wherein said means for turning on comprises means for providing a gate current to said silicon controlled rectifier from a drain of said MOS controlled thyristor.

11. The semiconductor switch of claim 9 wherein said silicon controlled rectifier and said MOS controlled thyristor are in adjacent regions in a single semiconductor device.

12. The semiconductor switch of claim 9 wherein said silicon controlled rectifier is an amplifying gate silicon controlled rectifier that derives silicon controlled rectifier gate current from the silicon controlled rectifier source.

13. An electrical switch comprising:

first and second switching devices, said first switching device comprising a MOS controlled thyristor and having a faster turn-on time and a higher di/dt capability than said second device; and switch control means controlling the operation of said first and second switching devices such that at the turn-on of the switch a current initially travels substantially through said first switching device, and subsequently substantially through said second switching device, said first switching device having a lower base and lower emitter generally coplanar with the same semiconductor type material as a corresponding lower base and a corresponding lower emitter of said second switching device.

14. The switch of claim 13 wherein said first and second switching devices are integrated into a single semiconductor device in alternating regions thereof.

15. The switch of claim 13 wherein said MOS controlled thyristor comprises plural generally parallel rows of cells with regions comprising said second switching device between said rows of cells.

16. An electrical switch circuit comprising:

a MOS controlled thyristor having source, drain and gate electrodes;

a silicon controlled rectifier having source, drain and gate electrodes, said rectifier being electrically connected to said thyristor substantially in parallel so that the sources of the rectifier and the thyristor are common and the drains of the rectifier and the thyristor are common;

a first gate means for selectively applying an electrical signal to the gate electrode of the thyristor; and a second gate means for selectively applying a second electrical signal to the gate electrode of the rectifier, whereby upon turning on the switch circuit and application of a voltage potential between the source and drain electrodes, the first and second gate control circuits are operated to establish initially substantially all of the current in the circuit through the thyristor and subsequently substantially through the rectifier.

17. The switch circuit of claim 16 wherein said silicon controlled rectifier and said MOS controlled thyristor are in adjacent regions in a monolithic integrated electrical circuit.

18. The switch circuit of claim 16 wherein a portion of the current flowing through the thyristor is passed into the second gate control circuit.

19. The switch circuit of claim 18 wherein the second gate control circuit is driven by both current flowing through the thyristor and by current flowing from a source external to the switch circuit.

20. A semiconductor switch comprising:

a silicon controlled rectifier having a first gate terminal;

a MOS controlled thyristor having a second gate terminal; and first control means to operate the first and second gate terminals such that when the switch is operated most of the current through the switch flows initially through the MOS controlled thyristor and subsequently through the silicon controlled rectifier.

21. The switch of claim 20 further comprising:

second control means to distribute at least a portion of the current through the MOS controlled thyristor to the first gate terminal.

22. The switch of claim 20 wherein said first control means provides gate signals to said first and second gate terminals.

23. The switch of claim 21 further comprising:

overload protection means to prevent the first gate terminal from receiving an overload of voltage.

24. An integral semiconductor switch comprising:

a semiconductor member;

plural silicon controlled rectifier (SCR) regions in said semiconductor member, each of said SCR regions having an initial forward voltage drop responsive to the rate of change of the current thereacross; and plural MOS controlled thyristor (MCT) regions in said semiconductor member, each operable one of said MCT regions being connected substantially in parallel with said SCR regions and having a smaller initial forward voltage drop than said SCR regions, said MCT regions and said SCR regions being arrayed in alternating portions of said semiconductor member.

25. The switch of claim 24 further comprising means for turning on operable ones of said MCT regions no later than said SCR regions.

26. A semiconductor device comprising:

a silicon controlled rectifier having an anode, a cathode and a gate, with its current conduction path between the anode and cathode formed to extend through at least a portion of a semiconductor substrate, and a MOS controlled thyristor having an anode, a cathode and a gate, with its current conduction path between the anode and the cathode formed to extend through at least a portion of the substrate, for conduction in the same direction as the current path of said rectifier, substantially in parallel to the current conduction path of said rectifier, and extending into at least a portion of the rectifier current path.

27. A semiconductor device as defined in claim 26 including:

circuit means for connecting the rectifier and thyristor gates together so that said thyristor gate receives a gate signal at least as soon as the rectifier gate.

28. The switch of claim 24 wherein the gate of the MCT is operated with respect to the gate of the SCR so that initially most of the current flow is through the MCT and subsequently most of the current flow is through the SCR.

* * * * *